(12) United States Patent
Brodsky et al.

(10) Patent No.: US 6,595,784 B2
(45) Date of Patent: Jul. 22, 2003

(54) INTERPOSER MEMBER HAVING APERTURES FOR RELIEVING STRESS AND INCREASING CONTACT COMPLIANCY

(75) Inventors: William Louis Brodsky, Binghamton, NY (US); David Vincent Caletka, Apalachin, NY (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/855,308

(22) Filed: May 15, 2001

(65) Prior Publication Data

US 2002/0173175 A1 Nov. 21, 2002

(51) Int. Cl.[7] .............................. H01R 12/00
(52) U.S. Cl. ........................ 439/66; 174/262
(58) Field of Search .................. 439/61, 71, 91, 439/73, 591; 29/848; 174/261, 262, 255

(56) References Cited

U.S. PATENT DOCUMENTS

| 4,902,234 A | 2/1990 | Brodsky et al. |
| 5,059,129 A | 10/1991 | Brodsky et al. |
| 5,099,393 A | 3/1992 | Bentlage et al. |
| 5,371,654 A | 12/1994 | Beaman et al. |
| 5,703,331 A | 12/1997 | Brodsky et al. |
| 5,759,047 A | 6/1998 | Brodsky et al. |
| 5,810,607 A | 9/1998 | Shih et al. |
| 5,818,700 A | 10/1998 | Purinton |
| 5,871,362 A | 2/1999 | Campbell et al. |
| 5,873,740 A | 2/1999 | Alcoe et al. |
| 5,932,047 A | 8/1999 | Brodsky et al. |
| 5,947,750 A | 9/1999 | Alcoe et al. |
| 5,953,816 A | 9/1999 | Pai et al. |
| 6,027,346 A | 2/2000 | Sinsheimer et al. |
| 6,050,832 A | 4/2000 | Lee et al. |
| 6,052,286 A | 4/2000 | Worthen et al. |
| 6,077,090 A | 6/2000 | Campbell et al. |

*Primary Examiner*—P. Austin Bradley
*Assistant Examiner*—Briggitte R Hammond
(74) *Attorney, Agent, or Firm*—Ronald A. D'Alessandro; Hoffman, Warnick & D'Alessandro (57) ABSTRACT

An interposer member having strategically positioned apertures for electrically connecting an electronic device to a circuitized substrate. The member includes a homogeneous elastomer core having strategically positioned apertures. The apertures are positioned through the member approximately equidistant between adjacent plated through holes and/or conductive pads. Such positioning relieves stress from the plated through holes and/or conductive pads, and increases the contact compliancy of the member.

36 Claims, 8 Drawing Sheets

INTERPOSER MEMBER HAVING APERTURES FOR RELIEVING STRESS AND INCREASING CONTACT COMPLIANCY

BACKGROUND OF THE INVENTION

1. Technical Field

The present invention generally relates to an interposer member having apertures for electrically connecting an electronic component to a circuitized substrate. More particular, the present invention relates to an interposer member having a homogeneous elastomer core with strategically positioned apertures for relieving stress and increasing contact compliancy of the member.

2. Background Art

In the production of microelectronics, electronic components (e.g., chip carriers) are often coupled to circuitized substrates (e.g., printed circuit boards). Currently, many methods exist for coupling components to substrates. Such methods include conductive pins, wirebonds, solder balls, etc. A component that is gaining increasing popularity in the field is a Land Grid Array (LGA) module. However, since LGA modules are not configured for direct connection to a substrate, many of the above-cited methods cannot be utilized. Several connectors currently exist for coupling an LGA module to a substrate. One example is the Metallized Polymer Interconnect (MPI) connector by Tyco International. The MPI connector includes a siloxane core with conductive fillers that is positioned between the LGA module and the substrate. However, in order to achieve a desired level of durability (e.g., performance at 70–80°C. over 5–10 years of operation), extremely slow stress relaxation rates are needed. To obtain slow stress relaxation rates in an elastomeric material such as the MPI connector, a homogeneous elastomer with a low density of unreacted polymer crosslinks and low contaminate contents are needed. These low contents can include low levels of residual cross-linking agents, which can act as contaminants promoting material stress relaxation mechanisms.

Another example of a connecter is shown in U.S. Pat. No. 5,818,700 to Purinton, herein incorporated by reference. Specifically, Purinton discloses a connector having a resin film with unfilled pores for increasing the compressibility of the connector. However, since the connector of Purinton has increased compressibility properties, a requisite level of stiffness is not maintained. Moreover, because the pores will "bleed out" (e.g., similar to foamed rubber) and are not strategically positioned, there is no stress relief for any plated through holes or conductive pads that may be positioned on the connector. Without such stress relief, the connector will often fail around the plated through holes and/or the conductive pads.

Other examples of connectors are shown in U.S. Pat. Nos. 4,902,234, 5,059,129 and 5,759,047 all to Brodsky et al., and assigned to the same assignee as the present invention. These references are herein incorporated by reference. None of these references, however, teach an interposer member having a homogeneous elastomer core for maintaining optimum stress relaxation properties. Moreover, none of the references teach an interposer member having strategically positioned apertures through the entire connector for relieving stress (e.g., on the plated through holes and conductive pads of the member) and increasing the contact compliancy of the member.

In view of the forgoing, there exists a need for an interposer member having a homogeneous elastomer core for maintaining optimum stress relaxation properties of the member. Moreover, a need exists for the strategic placement of apertures through the member for relieving stress on plated through holes and conductive pads of the member, and for increasing contact compliancy of the member.

SUMMARY OF THE INVENTION

The present invention overcomes the problems of existing connectors by providing an interposer member having a homogeneous elastomer core, and strategically positioned apertures. Specifically, the homogeneous elastomer core provides optimum stress relaxation and stiffness properties while the apertures provide stress relief for any plated through holes and/or conductive pads on the member. Moreover, the apertures provide increased contact compliancy of the member. The apertures are preferably positioned approximately equidistant between two adjacent plated through holes and/or conductive pads so that the stress fields surrounding each plated through hole and conductive pad do not intersect.

According to a first aspect of the present invention, an interposer member having apertures for relieving stress and increasing contact compliancy is provided. The member comprises: (a) a homogeneous elastomer core; (b) a plurality of conductive pads contacting the core; and (c) a plurality of apertures through the member, wherein the apertures are positioned at predetermined locations between adjacent conductive pads.

According to a second aspect of the present invention, an interposer member having apertures for relieving stress and increasing contact compliancy is provided. The member comprises: (a) a homogeneous elastomer core having a plurality of plated through holes; (b) an external flexible layer adhered to an outer surface of the core; (c) a plurality of conductive pads contacting the external flexible layer, wherein a conductive layer is positioned between each pad and the external flexible layer; and (d) a plurality of apertures through the member, wherein the apertures are positioned at predetermined locations between adjacent conductive pads and plated through holes.

According to a third aspect of the present invention, an interposer member having apertures for relieving stress and increasing contact compliancy is provided. The member comprises: (a) a homogeneous elastomer core; (b) a plurality of conductive pads contacting the core; and (c) a plurality of apertures through the member, wherein one of the apertures is positioned approximately equidistant between adjacent conductive pads.

According to a fourth aspect of the present invention, an interposer member having apertures for relieving stress and increasing contact compliancy is provided. The member comprises: (a) a homogeneous elastomer core; (b) an external flexible layer adhered to an outer surface of the core; (c) a plurality of conductive pads contacting the external flexible layer; and (d) a plurality of apertures through the member, wherein one of the apertures is positioned approximately equidistant between adjacent conductive pads.

According to a fifth aspect of the present invention, an interposer member having apertures for relieving stress and increasing contact compliancy is provided. The member comprises: (a) a homogeneous elastomer core having a plurality of plated through holes; (b) an external flexible layer adhered to an outer surface of the core; (c) a plurality of conductive pads contacting the external flexible layer, wherein a conductive layer is positioned between each pad and the external flexible layer; and (d) a plurality of apertures through the member, wherein the apertures are positioned approximately equidistant between adjacent plated through holes and conductive pads.

According to a sixth aspect of the present invention, a method for forming an interposer member having apertures for relieving stress and increasing contact compliancy is provided. The method comprises the steps of: (a) providing a homogeneous elastomer core; (b) positioning conductive pads on the core; and (c) forming a plurality of apertures through the member at predetermined locations between adjacent conductive pads.

According to a seventh aspect of the present invention, a method for forming an interposer member having apertures for relieving stress and increasing contact compliancy is provided. The method comprises the steps of: (a) providing a homogeneous elastomer core having a plurality of apertures; and (b) positioning conductive pads on the core, wherein one of the apertures is positioned approximately equidistant between adjacent conductive pads.

According to an eighth aspect of the present invention, a method for forming an interposer member having apertures for relieving stress and increasing contact compliancy is provided. The method comprises the steps of: (a) providing a homogeneous elastomer core having apertures; (b) adhering an external flexible layer to an outer surface of the core; and (c) positioning a plurality of conductive pads on the flexible layer, wherein one of the apertures is positioned approximately equidistant between adjacent conductive pads.

According to a ninth aspect of the present invention, a method for forming an interposer member having apertures for relieving stress and increasing contact compliancy is provided. The method comprises the steps of: (a) providing a homogeneous elastomer core having a plurality of plated through holes and a plurality of apertures; (b) adhering an external flexible layer to an outer surface of the core; and (c) positioning a plurality of conductive pads on the external flexible layer, wherein a conductive layer is positioned between each pad and the external flexible layer, and wherein the apertures are positioned approximately equidistant between adjacent plated through holes and conductive pads.

Therefore, the present invention provides an interposer member and method for producing the same. The member includes a homogeneous elastomer core having strategically positioned apertures for relieving stress and increasing contact compliancy.

BRIEF DESCRIPTION OF THE DRAWINGS

These and other features and advantages of this invention will be more readily understood from the following detailed description of the various aspects of the invention taken in conjunction with the accompanying drawings in which.

It is noted that the drawings of the invention are not necessarily to scale.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

Figure 1:
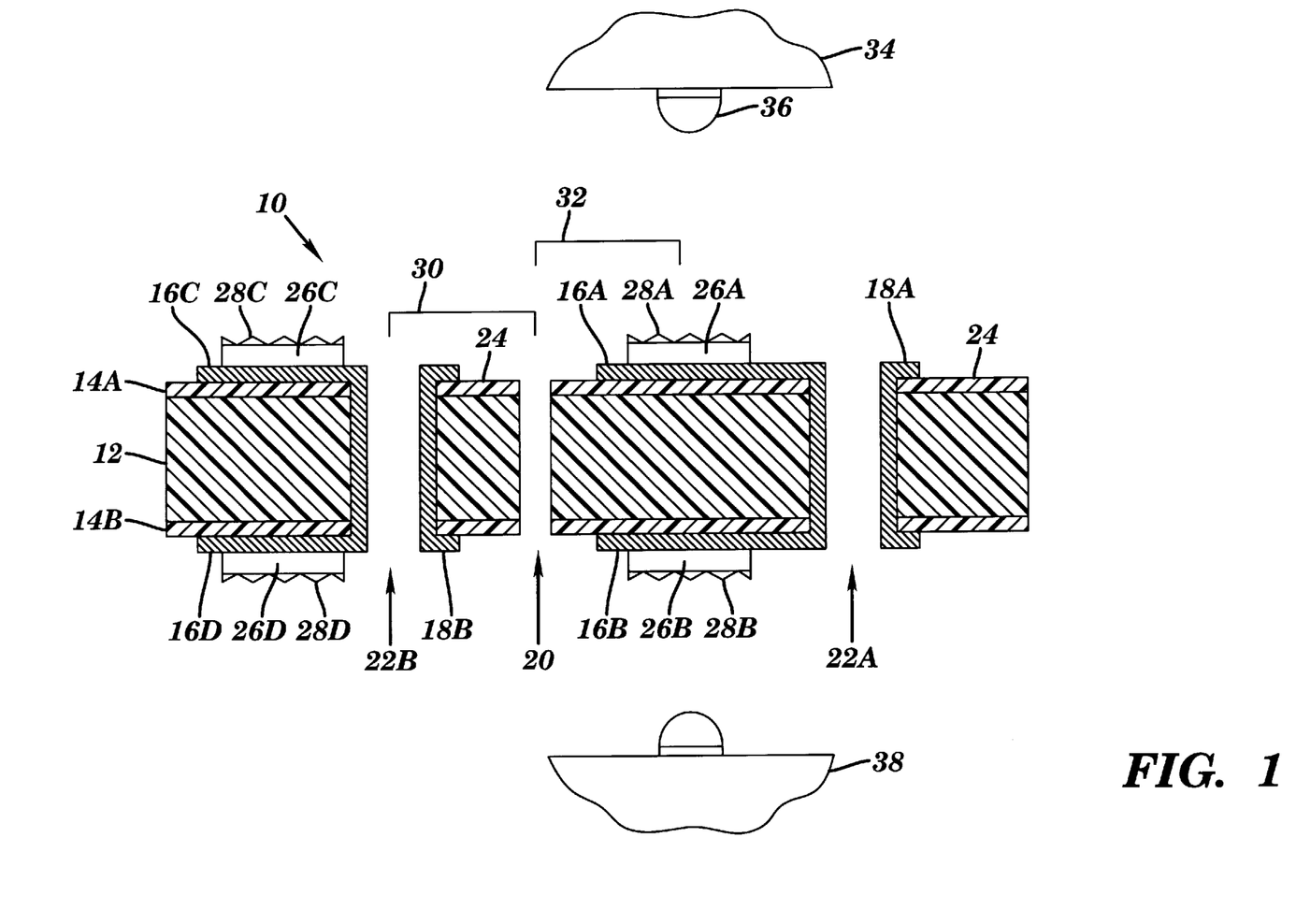
FIG. 1 depicts a partial cross-sectional view of an interposer member in accordance with a first embodiment of the present invention.

Referring now to FIG. 1, an interposer member 10 is depicted. As shown, member 10 includes core 12, external flexible layers 14A–B, conductive layers 16A–D, aperture 20, plated through holes 22A–B having metallization layers 18A–B, conductive pads 26A–D, and engineered contact surfaces 28A–D (e.g., dendrites, or diamond particle surfaces as produced by Nanopierce). Core 12 is preferably a homogeneous elastomer core such as the silicone elastomer LCS 745 with Varox cross-linking agent, available from Dow, Inc. External flexible layers 14A–B help provide stiffness to member 10 and are preferably a polyimide such as Kapton from Dupont, Inc. or Upilex from Ube Industries, Ltd. Flexible layers 14A–B are applied to core 12 using any means known in the art. For example, the surfaces of external flexible layers 14A–B that contact core 12 can be treated with an adhesion promoter and pressed onto core 12. External flexible layers 14A–B can then be bonded and cured (e.g., vulcanized) to core 12 to form a semi-rigid structure. On the outer surfaces of external flexible layers 14A–B, metal can be applied (e.g., by sputtering). Once the metal has been applied, conductive layers 16A–D (e.g., traces) can be formed using standard photolithography. Specifically, a photomask could be applied and then the surface could be patterned, developed, and etched. It should be understood that many methods can be used to bond external flexible layers 14A–B to core 12 as well as to form conductive layers 16A–D on external flexible layers 14A–B, all of which are well known to those of ordinary skill in the art. As further shown in FIG. 1, flexible layer 14A could include gaps 24. Gaps 24 may be made according to predetermined pattern(s) (as shown and described in U.S. Pat. No. 5,759,047) in either or both external flexible layers 14A–B to help to reduce stress and stiffness effects therein.

Once external flexible layers 14A–B have been bonded to core 12 and the metal applied, aperture 20 and plated through holes 22A–B can be drilled through the entire member 10. Following this, plated through holes 22A–B and surface circuitry can be cleaned, seeded, and plated with metallization layers 18A–B.

Conductive pads 26A–D can then be placed or plated in contact with conductive layers 16A–D, respectively. Conductive pads 26A–D are preferably formed from a metal substance such as copper and have an engineered contact surface 28A–D for optimal contact with electrical contact 36 of component 34. As stated above, engineered contact surfaces 28A–D could be diamond particles, roughened copper, dendrites or any other surface known in the art.

It should be appreciated that the order of steps described to form the various interposer members of the present invention (others to be described below) is not intended to be limiting. For example, the aperture 20 and plated through holes 22A–B could be drilled prior to forming conductive layers 16A–D, or could be pre-molded into core 12.

Member 10 allows an electrical component 34, such as an LGA module, to be coupled to circuitized substrate 38. The precise positioning of aperture 20 provides optimal stress relief for plated through holes 22A–B and conductive pads 26A–D as well as increased contact compliance of member 10. Specifically, aperture 20 is preferably positioned approximately equidistant between adjacent plated through holes 22A–B and/or conductive pads 26A–D. As shown in FIG. 1, aperture 20 is positioned at a distance 30 from plated through hole 22B that is approximately equal to distance 32 of aperture 20 from conductive pad 26A.

Under the present invention, an aperture 20 can be positioned between two adjacent plated through holes 22A–B (shown in FIG. 7), between two adjacent conductive pads 26A–D (shown in FIG. 5), or between a plated through hole 22B and an adjacent conductive pad 26A (as shown in FIG. 1). In previous devices, no such apertures were provided. Accordingly, stress was not relieved from the plated through holes or conductive pads. This often resulted in premature failure of the device, and a stiffer contact and less compliance for mating tolerances.

Figure 2:
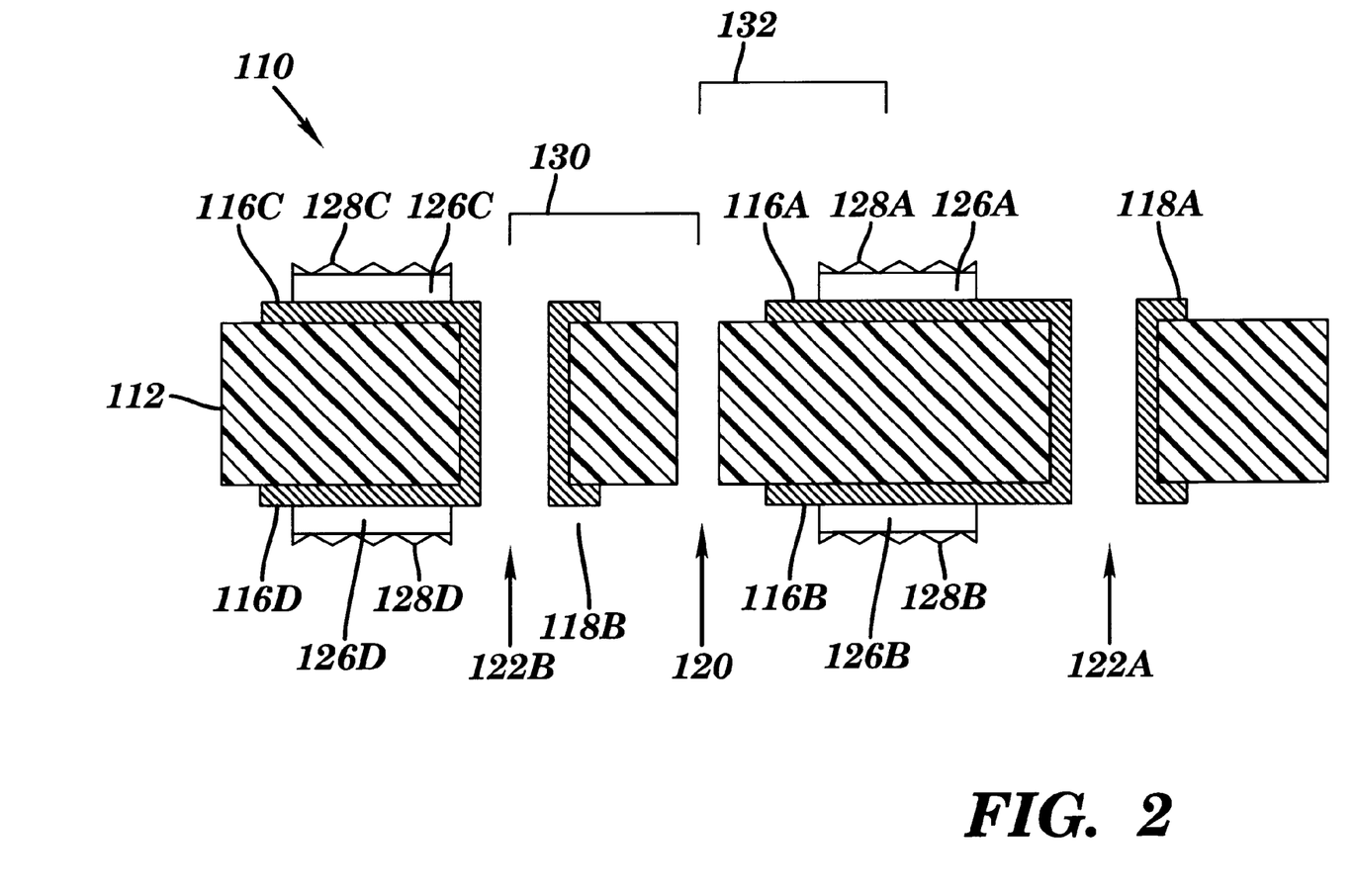
FIG. 2 depicts a partial cross-sectional view of an interposer member in accordance with a second embodiment of the present invention.

Referring now to FIG. 2, an interposer member 110 according to a second embodiment of the present invention is shown. Member 110 has components and construction similar to interposer 10 of FIG. 1. However, as depicted, member 110 lacks external flexible layers 14A–B. Specifically, member 110 includes homogeneous elastomer core 112, conductive layers 116A–D, metallization layers 118A–B, aperture 120, plated through holes 122A–B, and conductive pads 126A–D having engineered contact surfaces 128A–D. Since external flexible layers are absent, conductive layers 116A–D are formed directly on the outer surfaces of core 112. Conductive layers 116A–D are formed, as described above, using any means known in the art. For instance, metal may be applied to core 112, and traces may be formed using photolithography to yield conductive layers 116A–D. Aperture 120 and plated through holes 122A–B are then drilled through the entire member 110. Plated through holes 122A–B and any surface circuitry are then plated with metallization layers 118A–B, respectively, using a cleaning, seeding, and plating operation.

As indicated above, aperture 120 is preferably positioned (e.g., drilled, or molded into core 112) approximately equidistant between adjacent conductive pads and/or plated through holes. Specifically, aperture 120 is positioned at a distance 130 from plated through hole 122B that is approximately equal to a distance 132 between aperture 120 and conductive pad 126A. Such strategic positioning helps relieve stress from the plated through hole 122B and conductive pad 126A while increasing contact compliancy of the member 110.

Figure 3:
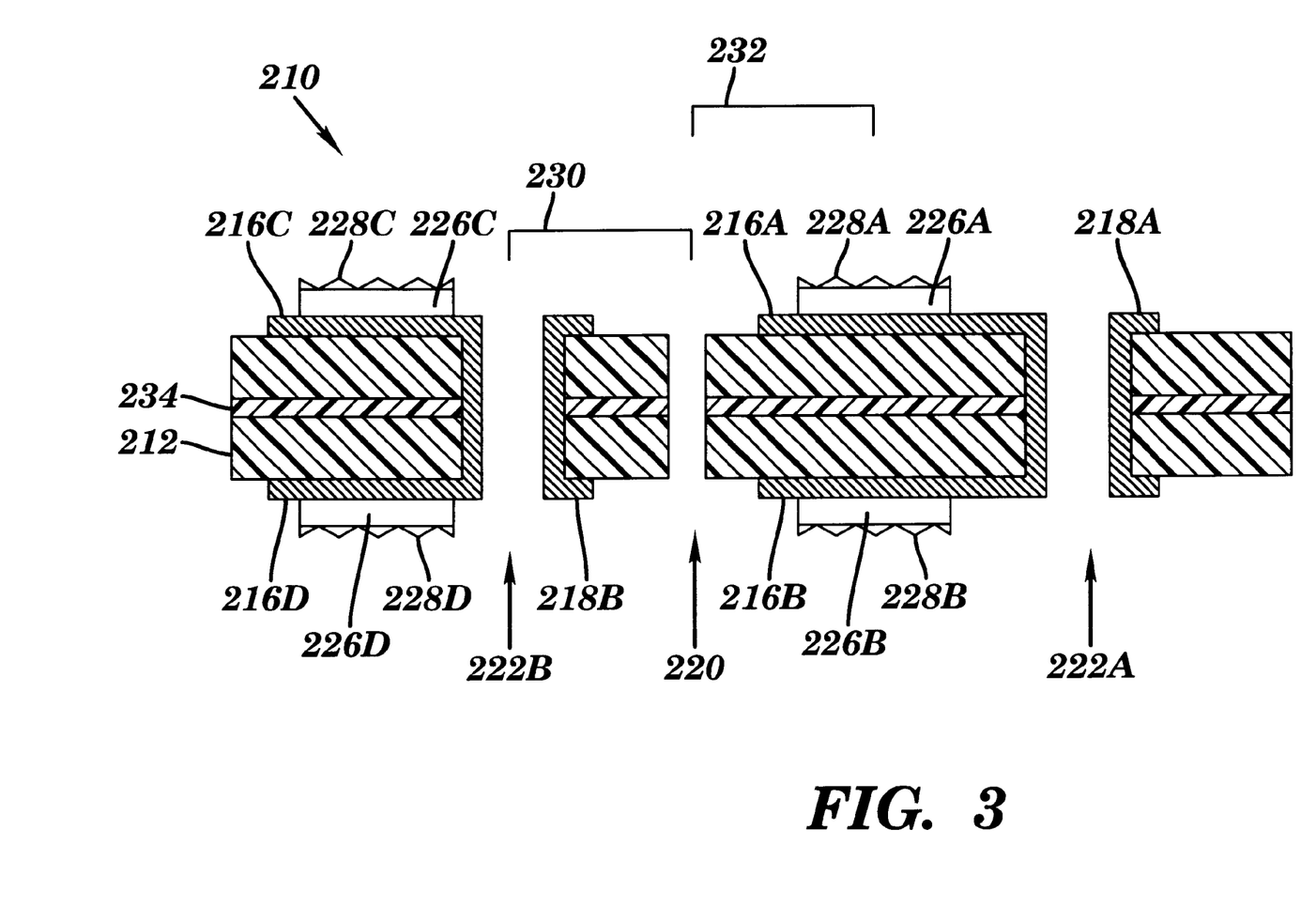
FIG. 3 depicts a partial cross-sectional view of an interposer member in accordance with a third embodiment of the present invention.

Referring now to FIG. 3, a third interposer member 210 according to the present invention is shown. Member 210 has components (i.e., homogeneous elastomer core 212, conductive layers 216A–D, metallization layers 218A–B, aperture 220, plated through holes 222A–B, and conductive pads 226A–D having engineered contact surfaces 228A–D) and construction similar to member 110 of FIG. 2. However, that member 210 also includes an internal flexible layer 234 within homogeneous elastomer core 212. Internal flexible layer 234 is similar to external flexible layers 14A–B of member 10 (FIG. 1) and is preferably a polyimide such as Kapton or Upilex. Internal flexible layer 234 is used in cases where a thin core 212 is utilized. In particular, a homogeneous elastomer core 212 typically has a coefficient of thermal expansion of approximately 275 parts per million, which makes a thin core extremely difficult to process and handle. The use of internal flexible layer 234 provides dimensional stability to such thin cores 212.

To form the core 212 shown in FIG. 3, internal flexible layer 234 is preferably molded to separate pieces of core 212. Specifically, both sides of internal flexible layer 214 are coated with an adhesion promoter and then joined to separate pieces of homogeneous elastomer core 212. The resulting structure is then bonded and cured to yield a single core 212. Conductive layers 216A–D, conductive pads 226A–D, aperture 220, and plated through holes 222 are then formed as described above in conjunction with FIGS. 1 and 2 to yield member 210. As described above, aperture 220 is preferably a distance 230 from plated through hole 222B that is approximately equal to a distance 232 of aperture 220 from adjacent conductive pad 226A.

Figure 4:
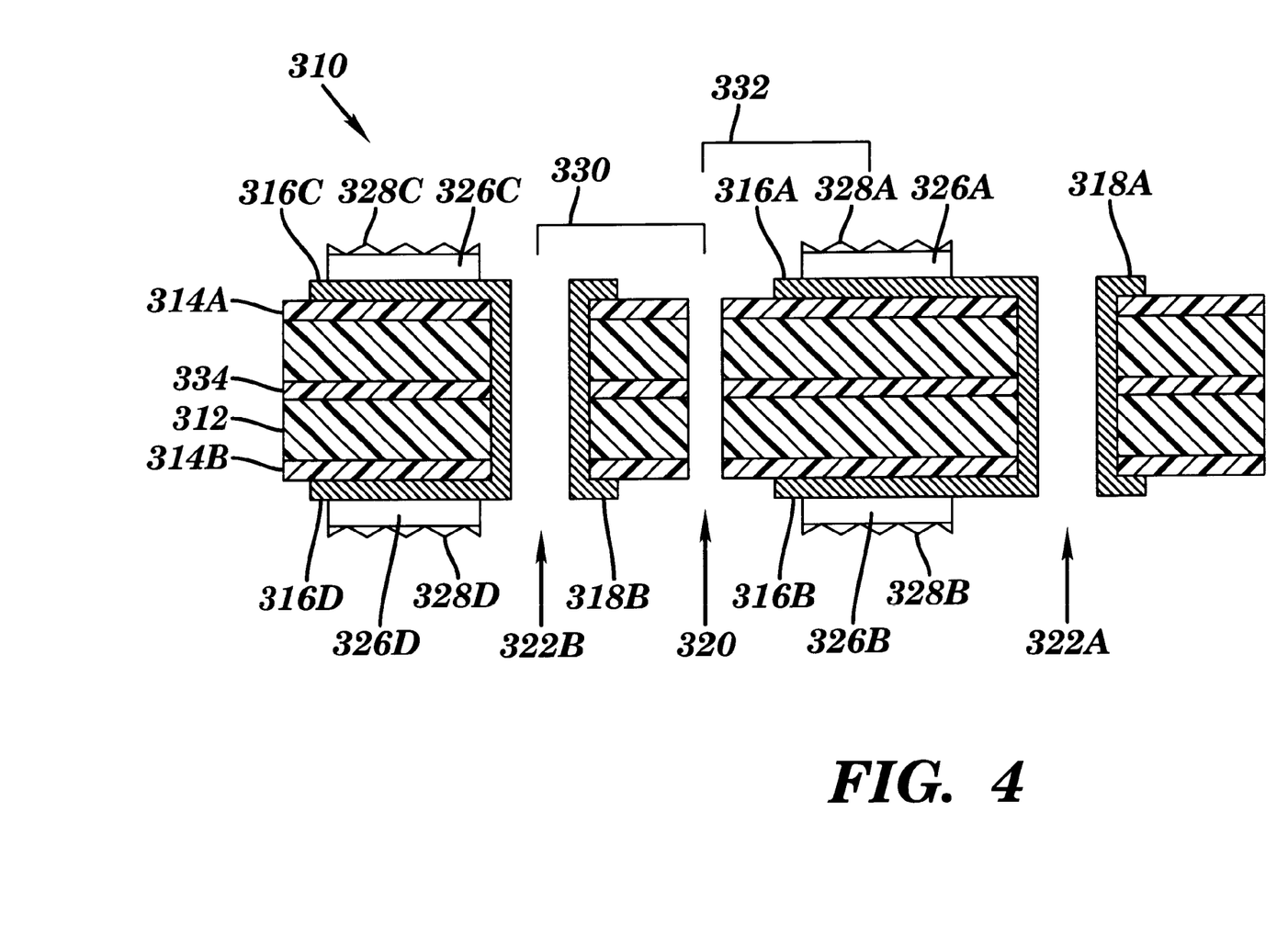
FIG. 4 depicts a partial cross-sectional view of an interposer member in accordance with a fourth embodiment of the present invention.

Referring now to FIG. 4, an interposer member 310 in accordance with a fourth embodiment of the present invention is shown. Specifically, member 310 has components (i.e., homogeneous elastomer core 312, conductive layers 316A–D, metallization layers 318A–B, aperture 320, plated through holes 322A–B, conductive pads 326A–D having engineered contact surfaces 328A–D, and internal flexible membrane 334), and construction similar to member 210. However, member 310 includes external flexible layers 314A–B as well as internal flexible layer 334. In this embodiment, conductive layers 316A–D are formed on an outer surface of external flexible layers 314A–B as described above in conjunction with FIG. 1. Similar to the above-described members 10, 110, and 210, aperture 320 of member 310 is preferably positioned at a distance 330 from plated through hole 322B that is approximately equal to a distance 332 of aperture 320 from conductive pad 326A. It should be understood that similar to member 10 of FIG. 1, external flexible layers 314A and/or 314B can include gaps (not shown) to help to reduce stress and stiffness effects therein.

Figure 5:
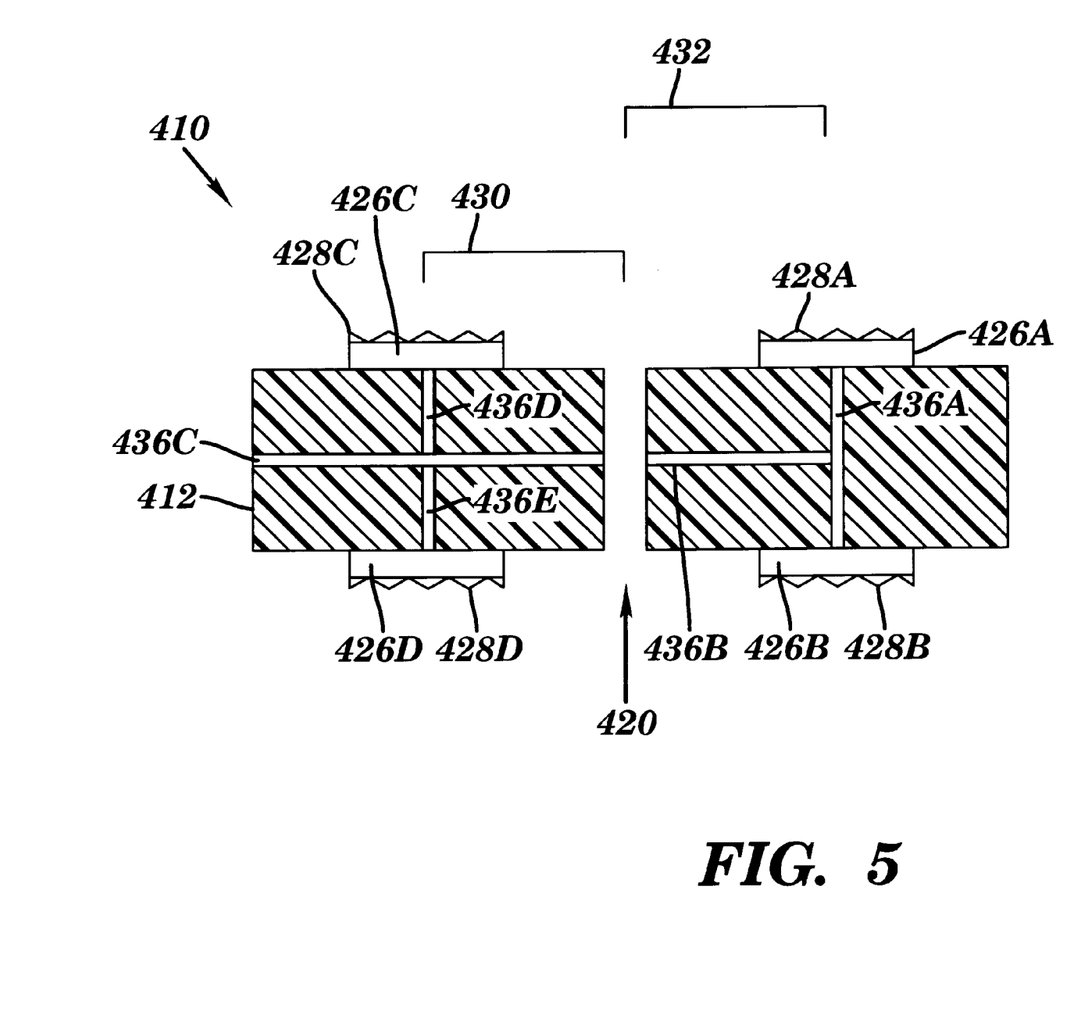
FIG. 5 depicts a partial cross-sectional view of an interposer member in accordance with a fifth embodiment of the present invention.

FIG. 5 depicts an interposer member 410 according to a fifth embodiment of the present invention. As depicted, member 410 includes homogeneous elastomer core 412, conductive pads 426A–D joined directly to core 412, engineered contact surfaces 428A–D, and internal conductors 436A–E. Internal conductors 436A–E are molded into core 412 using any known means and obviate the need for member 410 to include plated through holes and conductive layers. As shown, conductors 436A–E electrically connect components (e.g., conductive pads 426A and 426B) of member 410. Accordingly, a more simple structure results. It should be appreciated that member 410 could also include external flexible layers with or without gaps. In such a case, conductive pads 426A–D would be directly joined to the external flexible layers and not the core 412.

As shown, aperture 420 is preferably positioned at a distance 430 from conductive pads 426C–D that is approximately equal to a distance 432 of aperture 420 from conductive pads 426A–B. This demonstrates that apertures cannot only be positioned between a plated through hole and an adjacent conductive pad, but also between two adjacent conductive pads. As indicated above, such placement relieves the stress on conductive pads 426A–D as well as increases the contact compliancy of member 410.

Figure 6:
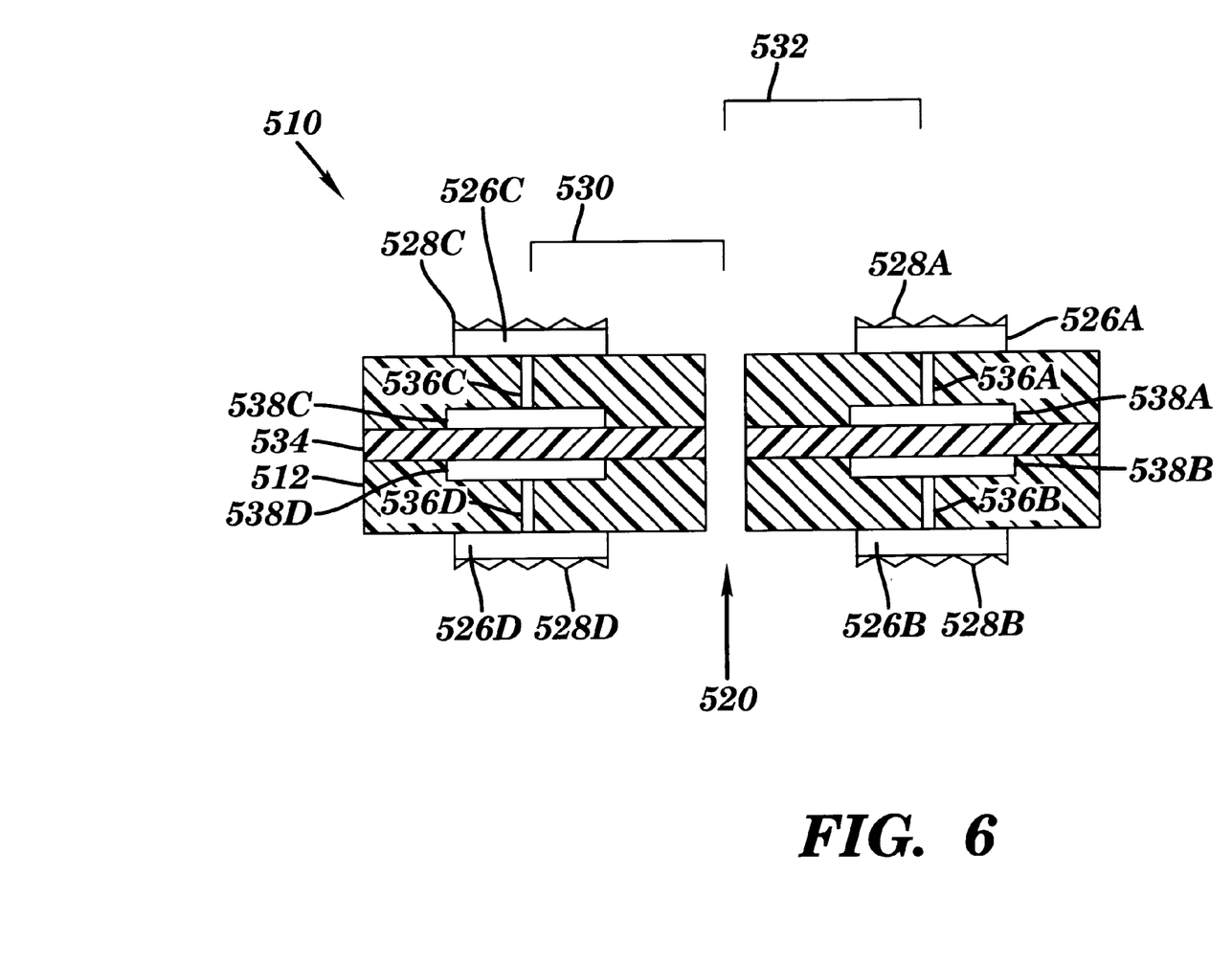
FIG. 6 depicts a partial cross-sectional view of an interposer member in accordance with a sixth embodiment of the present invention.

Referring now to FIG. 6, an interposer member 510 in accordance with a sixth embodiment of the present invention is shown. Member 510 is similar to member 410 of FIG. 5. Specifically, member 510 includes homogeneous elastomer core 512, aperture 520, conductive pads 526A–D having engineered contact surfaces 528A–D, and internal conductors 536A–D. However, member 510 also includes an internal flexible layer 534. Internal flexible layer 534 is preferably molded into member 510 as describe above in conjunction with FIGS. 3 and 4 (e.g., by adhering both sides of internal flexible layer 534 to separate pieces of core 512). Moreover, internal flexible layer 534 is especially useful in maintaining the dimensional stability of member 510 when using a thin core 512.

As depicted, internal flexible member 534 can also include internal conductive layers 538A–D, which are contacted by conductors 536A–D, respectively. This embodiment comprises a multi-layered interposer member 510. Specifically, it may be desirable for interposer members to have multiple layers with each layer functioning electronically. By implementing conductors 536A–D and internal conductive layers 538A–D, each layer can communicate with each other. Internal conductive layers 538A–D are preferably formed on internal flexible layer 534 in the same manner that conductive layers 16A–D were formed on external flexible layers 14A–B of member 10 above. Specifically, metal is applied (e.g., by sputtering) and then traces are formed using standard photolithography. The surface circuitry can also be cleaned, seeded and plated as described above.

Similar to member 410 of FIG. 5, aperture 520 of member 510 is preferably positioned at a distance 530 from conductive pads 526C–D that is approximately equal to a distance 532 of aperture 520 from conductive pads 526A–B. Such positioning of aperture 520 relieves stress from conductive pads 526A–D and increases the contact compliancy of member 510. It should be understood that member 510 could also include external flexible layers with or without gaps.

Figure 7:
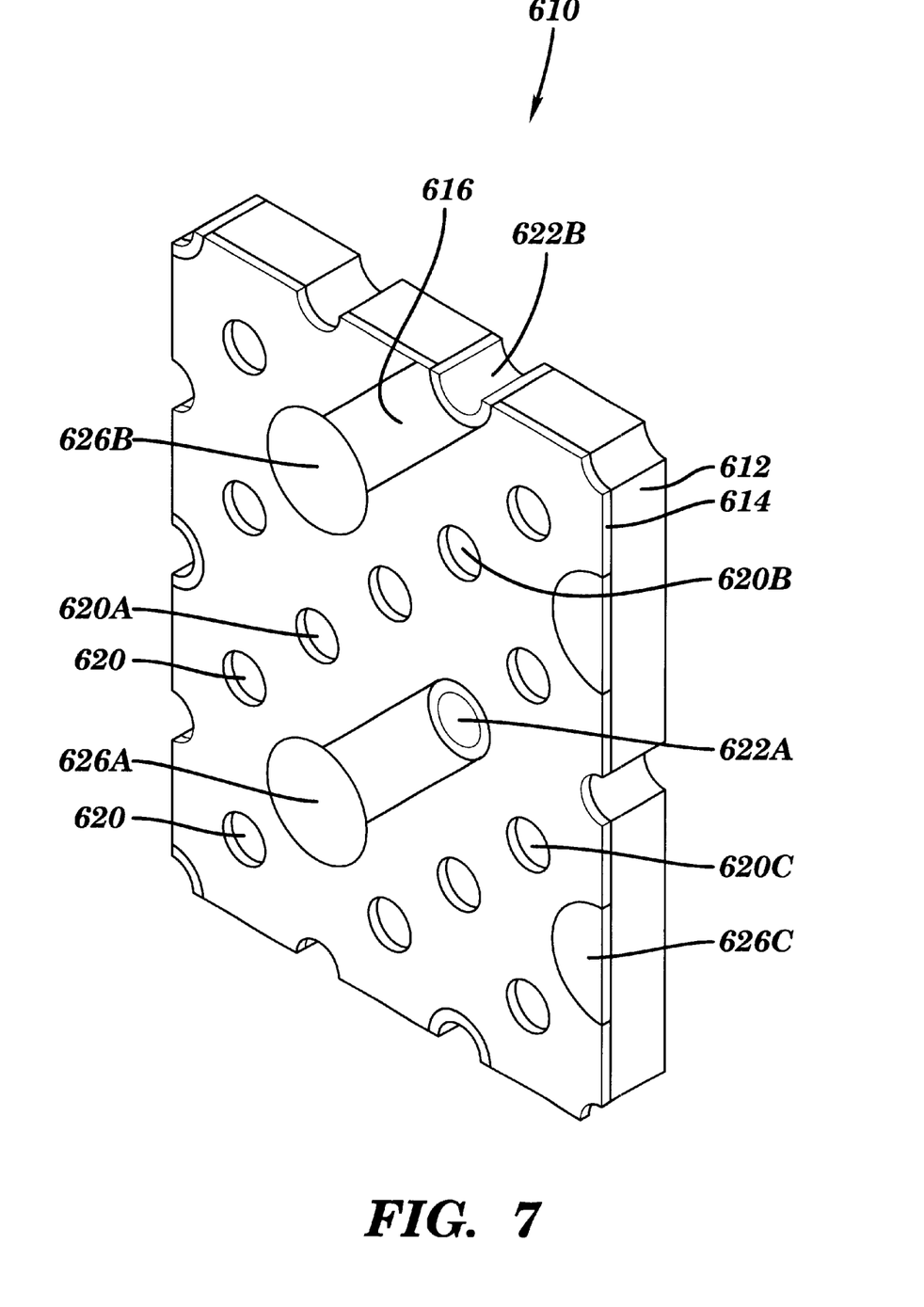
FIG. 7 depicts a partial isometric view of an interposer member in accordance with the present invention.

Referring now to FIG. 7, a partial isometric view of an interposer member 610 in accordance with the teachings of present invention is shown. As depicted, member 610 includes homogeneous elastomer core 612, external flexible layer 614, conductive layer 616, apertures 620 (including apertures 620A–C), plated through holes 622A–B, and conductive pads 626A–C. Although not shown, member 610 could also include an internal flexible layer. As indicated above, apertures can be positioned approximately equidistant between two adjacent conductive pads, two adjacent plated through holes, or a plated through hole and an adjacent conductive pad. As shown: (1) aperture 620A is approximately equidistant between conductive pads 626A and 626B; (2) aperture 620B is positioned approximately equidistant between plated through holes 622A and 622B; and (3) aperture 620C is positioned approximately equidistant between plated through hole 622A and conductive pad 626C. Such strategic placement of apertures 620A–C relieves stress on the adjacent plated through holes 622A–B and conductive pads 626A–C, as well as increases the contact compliancy of the entire member 610.

By way of example of the various embodiments of the present invention, an interposer having contact pads on a 1 mm grid or inter pad spacing could have the following dimensions: (1) conductive pad diameter—about 0.5 mm; (2) aperture diameter—about 0.24 mm; (3) plated through hole diameter as drilled—about 0.25 mm; and (4) finished plated through hole diameter—about 7.88 mm.

Figure 8:
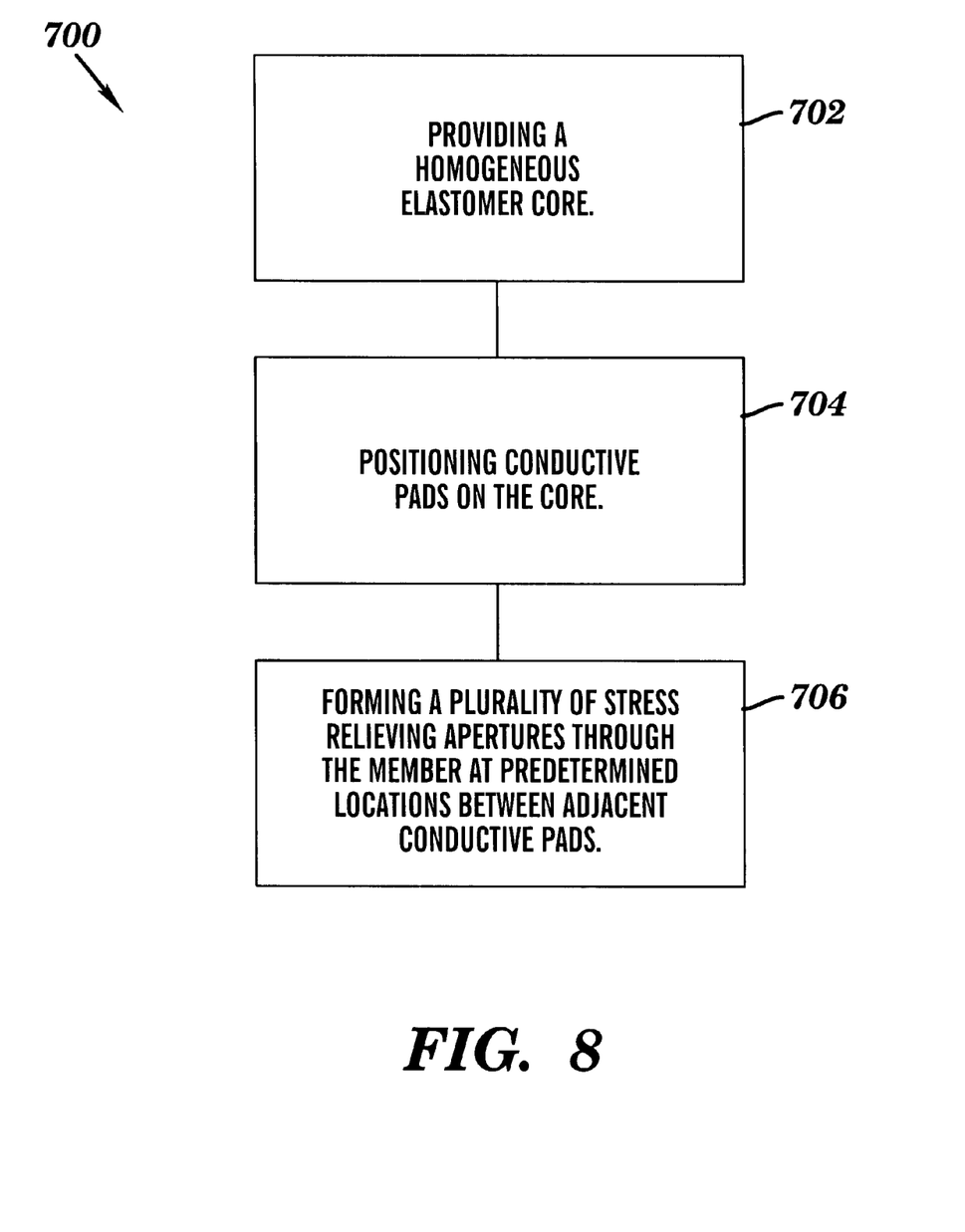
FIG. 8 depicts a method flow chart in accordance with the present invention.

Referring now to FIG. 8, a flowchart of a method 700 according to the present invention is shown. First step 702 is to provide a homogeneous elastomer core. Second step 704 of method 700 is to position conductive pads on the core. Third step 708 of method 700 is to form a plurality of apertures through the member at predetermined locations between adjacent conductive pads.

It should be appreciate that the foregoing figures and corresponding descriptions of the above interposer members are intended to be illustrative. They are not intended to be exhaustive or to limit the invention to the precise form disclosed, and obviously, many modifications and variations could exist. For example, the members could include a different quantity of apertures, plated through holes, and/or conductive pads. Moreover, other methods for constructing the members and their components are well known to those in the art and could be implemented. Such modifications and variations that may be apparent to a person skilled in the art are intended to be included within the scope of this invention as defined by the accompanying claims.

What is claimed is:

1. An interposer member having apertures for relieving stress and increasing contact compliancy, comprising:

a homogeneous elastomer core;

a plurality of conductive pads contacting the core, wherein at least one conductive pad contacts a first opposing side of the core, and wherein at least one conductive pad contacts a second opposing side of the core; and wherein the apertures extend through the core, and wherein the apertures are positioned at predetermined locations between adjacent conductive pads.

2. The interposer member of claim 1, wherein the core is a silicone elastomer.

3. The interposer member of claim 1, further comprising a conductive layer positioned between each conductive pad and the core.

4. The interposer member of claim 1, further comprising a plurality of plated through holes, wherein one of the apertures is positioned between two adjacent plated through holes.

5. The interposer member of claim 1, further comprising a plurality of plated through holes, wherein one of the apertures is positioned between one of the plated through holes and an adjacent conductive pad.

6. The interposer member of claim 1, wherein one of the apertures is positioned between two adjacent conductive pads.

7. The interposer member of claim 1, further comprising an internal conductor positioned within the core.

8. The interposer member of claim 1, further comprising an external flexible layer directly contacting an outer surface of the core, wherein the external flexible layer is positioned between the conductive pads and the core.

9. The interposer member of claim 8, wherein the flexible layer is a polyimide.

10. The interposer member of claim 1, further comprising an internal flexible layer positioned within the core.

11. The interposer member of claim 10, wherein the internal flexible layer includes an internal conductive layer.

12. An interposer member having apertures for relieving stress and increasing contact compliancy, comprising:

a homogeneous elastomer core having a plurality of plated through holes;

an external flexible layer adhered to an outer surface of the core;

a plurality of conductive pads contacting the external flexible layer, wherein a conductive layer is positioned between each pad and the external flexible layer; and wherein the apertures extend through the core and the external flexible layer, and wherein the apertures are positioned at predetermined locations between adjacent conductive pads and plated through holes.

13. The interposer member of claim 12, further comprising an internal conductor positioned within the core.

14. The interposer member of claim 12, wherein the core is a silicone elastomer, and wherein the external flexible layer is a polyimide.

15. The interposer member of claim 12, wherein one of the apertures is positioned between two adjacent plated through holes.

16. The interposer member of claim 12, wherein one of the apertures is positioned between two adjacent conductive pads.

17. The interposer member of claim 12, wherein one of the apertures is positioned between one of the plated through holes and an adjacent conductive pad.

18. The interposer member of claim 12, further comprising an internal flexible layer positioned within the core.

19. The interposer member of claim 18, further comprising a conductive layer on the internal flexible layer.

20. An interposer member having apertures far relieving stress and increasing contact compliancy, comprising:
  a homogeneous elastomer core;
  a plurality of conductive pads contacting the core, wherein at least one conductive pad contacts a first opposing side of the core, and wherein at least one conductive pad contacts a second opposing side of the core; and
  wherein the apertures extend through die core, and wherein one of the apertures is positioned between adjacent conductive pads.

21. An interposer member having apertures for relieving stress and increasing contact compliancy, comprising:
  a homogeneous elastomer core;
  an external flexible layer adhered to an outer surface of the core;
  a plurality of conductive pads contacting the external flexible layer; and
  wherein the apertures extend through the core and the external flexible layer, and wherein one of the apertures is positioned between adjacent conductive pads.

22. An interposer member having apertures for relieving stress and increasing contact compliancy, comprising:
  a homogeneous elastomer core having a plurality of plated through holes;
  an external flexible layer adhered to an outer surface of the core;
  a plurality of conductive pads contacting the external flexible layer, wherein a conductive layer is positioned between each pad and the external flexible layer; and
  wherein the apertures extend through the core and the external flexible layer, and wherein the apertures are positioned between adjacent conductive pads and plated through holes.

23. A method for fanning an interposer member having apertures for relieving stress and increasing contact compliancy, comprising the steps of:
  providing a homogeneous elastomer core;
  positioning conductive pads on the core, wherein at least one conductive pad is positioned on a first opposing side of the core, and wherein at least one conductive pad is positioned on a second opposing side of the core; and
  forming the apertures through the core at predetermined locations between adjacent conductive pads.

24. The method of claim 23, further comprising the step of forming a conductive layer on the core, wherein the conductive layer is positioned between the core and the conductive pads.

25. The method of claim 23, further comprising the steps of:
  adhering a first surface of an external flexible layer directly to an outer surface of the core; and
  forming a conductive layer on a second surface of the flexible layer.

26. The method of claim 23, further comprising the step of positioning an internal flexible layer within the core.

27. The method of claim 23, further comprising the step of positioning a conductor within the core.

28. The method of claim 23, wherein the step of forming a plurality of apertures comprises the step of forming an aperture between two conductive pads.

29. The method of claim 23, wherein the step of positioning the internal flexible layer within the core, comprises the steps of: providing a flexible layer having a first and a second side;
  applying an adhesion promoter to the first and the second side; and
  contacting the first side with a first elastomer and contacting the second side with a second elastomer.

30. The method of claim 24, further comprising the step of forming a conductive layer on the internal flexible layer.

31. The method of claim 23, further comprising the step of forming a plurality of plated through holes in the member.

32. The method of claim 31, wherein the step of forming a plurality of apertures comprises the step of forming an aperture between two adjacent plated through holes.

33. The method of claim 31, wherein the step of forming a plurality of apertures comprises the step of forming an aperture between a conductive pad and an adjacent plated through hole.

34. A method for forming an interposer member having apertures for relieving stress and increasing contact compliancy, comprising the steps of:
  providing a homogeneous elastomer core, wherein the apertures extend through the core; and
  positioning conductive pads on the core, wherein at least one conductive pad is positioned on a first opposing side of the core, wherein at least one conductive pad is positioned on a second opposing side of the core, and wherein one of the apertures is positioned between adjacent conductive pads.

35. A method for forming an interposer member having apertures for relieving stress and increasing contact compliancy, comprising the steps of:
  providing a homogeneous elastomer core;
  adhering an external flexible layer to an outer surface of the care, wherein the apertures extend through the external flexible layer and the core; and
  positioning a plurality of conductive pads on the flexible layer, wherein one of the apertures is positioned between adjacent conductive pads.

36. A method for forming an interposer member having apertures for relieving stress and increasing contact compliancy, comprising the steps of:
  providing a homogeneous elastomer core having a plurality of plated through holes;
  adhering an external flexible layer to an outer surface of the core, wherein the apertures extend through the external flexible layer and the core; and
  positioning a plurality of conductive pads on the external flexible layer, wherein a conductive layer is positioned between each pad and the external flexible layer, and wherein the apertures are positioned between adjacent plated through holes and conductive pads.

* * * * *

UNITED STATES PATENT AND TRADEMARK OFFICE
CERTIFICATE OF CORRECTION

PATENT NO. : 6,595,784 B2
DATED : July 22, 2003
INVENTOR(S) : Brodsky et al.

It is certified that error appears in the above-identified patent and that said Letters Patent is hereby corrected as shown below:

<u>Title page,</u>
Item [73], Assignee, delete "NJ" and insert -- NY --;

<u>Column 9,</u>
Line 20, delete "far" and insert -- for --;
Line 53, delete "fanning" and insert -- forming --;

<u>Column 10,</u>
Line 22, delete "24" and insert -- 29 --;
Line 48, delete "care" and insert -- core --.

Signed and Sealed this

Eleventh Day of November, 2003

JAMES E. ROGAN
*Director of the United States Patent and Trademark Office*